United States Patent [19]

Veistinen

[11] Patent Number: 4,966,668

[45] Date of Patent: Oct. 30, 1990

[54] METHOD FOR THE TREATMENT OF METAL OBJECTS

[75] Inventor: Mauri K. Veistinen, Espoo, Finland

[73] Assignee: Outokumpu Oy, Helsinki, Finland

[21] Appl. No.: 277,799

[22] Filed: Nov. 29, 1988

Related U.S. Application Data

[63] Continuation-in-part of Ser. No. 36,083, Apr. 9, 1987, abandoned.

[30] Foreign Application Priority Data

May 7, 1986 [FI] Finland .................................. 861898

[51] Int. Cl.$^5$ .............................................. C23C 14/00
[52] U.S. Cl. ................................ 204/192.31; 148/101
[58] Field of Search ................... 148/302, 101; 420/83, 420/121; 204/192.31

[56] References Cited

FOREIGN PATENT DOCUMENTS 0190461 8/1986 European Pat. Off. ............ 148/302
56-81908 7/1981 Japan .

Primary Examiner—John P. Sheehan
Attorney, Agent, or Firm—Dellett, Smith-Hill and Bedell

[57] ABSTRACT

A sintered permanent magnet having the composition $RE_2T_{14}B$, where RE is a rare earth metal, T is a transition metal and B is boron, is treated by ion plating the magnet at an elevated temperature in the presence of a gas phase.

15 Claims, No Drawings

METHOD FOR THE TREATMENT OF METAL OBJECTS

CROSS-REFERENCED TO RELATED APPLICATION

This is a continuation-in-part of co-pending patent application Ser. No. 07/036,083 filed Apr. 9, 1987 now abandoned.

BACKGROUND OF THE INVENTION

The present invention relates to a method for the treatment of metal objects, particularly for the thermal treatment of sintered permanent magnets containing rare earth metals.

Iron, boron and neodymium form the compound $Nd_2Fe_{14}B$, which has excellent permanent-magnetic properties. The so-called NEO magnets, which are already in commercial production, are mainly composed of this compound. In addition to neodymium, the NEO magnets may also contain other rare earth metals, such as dysprosium, and in addition to iron also other transition metals such as cobalt.

In the production of NEO magnets, a cast metal alloy is crushed and pulverized, whereafter the powdered metal is compacted and sintered. After sintering, the magnets are subjected to thermal treatment at a temperature of about 600° C. for about an hour in order to increase their internal coercive force. After the thermal treatment, the magnets undergo a finishing grinding. Finally, because iron and particularly neodymium are very reactive metals, these magnets must be coated either with metal or with plastic before being put into use.

In many applications a high accuracy in the dimensions of the magnets is required, and therefore the coating process must be accurately adjustable. Aluminum, which can be for instance vacuum evaporated onto the magnet surface, has been used as a coating material for NEO magnets. Although the method of vacuum evaporation, where the workpiece is not heated, is simple and widely used, it has a drawback in that the coating tends to adhere rather poorly.

The purpose of the present invention is to eliminate some of the drawbacks of the prior art and to achieve an improved and more secure method of treating sintered permanent magnets so that the magnets can also be utilized in cases where the conditions require a corrosion-proof product.

SUMMARY OF THE INVENTION

A preferred embodiment of the invention in a first aspect is a method of treating a sintered permanent magnet having the composition $RE_2T_{14}B$, where RE is a rare earth metal, T is a transition metal and B is boron, comprising applying a coating to the permanent magnet by ion plating at an elevated temperature in the presence of a gas phase.

A preferred embodiment of the invention in a second aspect is a method of treating a sintered permanent magnet having the composition $RE_2T_{14}B$, where RE is a rare earth metal, T is a transition metal and B is boron, comprising placing the magnet in a chamber, cleaning the magnet by sputtering, and applying a coating to the magnet by connecting the magnet and a body of metal that is in the chamber to a dc voltage source as cathode and anode respectively, establishing a pressure of about $10^{-3}$ mbar in the chamber, and heating the body of metal so that the metal evaporates.

The term "ion plating," as used herein, means a method of forming a coating of metal or metal-based material on a workpiece of conductive material by (a) disposing the workpiece and a body of the metal that is to form, or be the basis of, the coating in an atmosphere of a selected gas, (b) cleaning the surface of the workpiece by sputtering with gas ions, (c) connecting the body of metal and the workpiece to a dc voltage source as anode and cathode respectively, and (d) heating the body of metal so that the metal evaporates, whereby the metal is ionized and a plasma of positively charged metal ions is formed and the ions of the evaporated metal are attracted to the workpiece and are deposited as atoms on its surface.

If a process embodying the invention is applied to the treatment of a sintered permanent magnet, particularly a magnet containing a rare earth metal, the magnet is treated thermally and coated concurrently. Thus, no extra time is required to carry out the coating, and both time and money are saved. In addition, the coating can be made accurate in its dimensions and will adhere properly.

DETAILED DESCRIPTION

The combination of thermal treatment and coating in the manufacture of permanent magnets that have the compound form $RE_2T_{14}B$, where RE is a rare earth metal such as neodymium, dysprosium, praseodymium or cerium, T is a transition metal such as iron or cobalt, and B is boron, is carried out by ion plating.

The magnet is disposed in a chamber, with a body of a metal that is to form, or be the basis of, the coating on the magnet. During the cleaning stage, an atmosphere of a selected gas is provided in the chamber, at a pressure of $10^{-2}$ to $10^{-4}$ mbar. The magnet is connected as a cathode, and a potential difference between 400 and 600 v is established between the magnet and an anode. The gas in the chamber is ionized, and the positive ions bombard the magnet, cleaning it by sputtering. The cleaning operation may be carried out for a time between 30 minutes and 2 hours, and the temperature of the magnet rises to between 340°–360° C., but it may with advantage increase still higher, e.g. to 550°–600° C. The body of metal is not connected to a voltage source during the cleaning stage.

During the coating stage of the ion plating operation, which takes place at a pressure in the range from $10^{-4}$–$10^{-1}$ mbar, the magnet and the body of metal are connected to a d.c. source having a voltage between 80 and 430 v, preferably between 80 and 150 v, as cathode and anode respectively, and the body of metal is heated so that the metal evaporates and forms a plasma of positive metal ions. The metal ions are attracted to the magnet and are deposited thereon, forming a coating that adheres firmly to the magnet.

During the coating stage, the temperature of the magnet reaches the range of 550°–700° C., preferably 600°–630° C., and accordingly the magnet undergoes thermal treatment concurrently with the coating. The coating process as such takes up only a short time, and the major part of the duration of the treatment is occupied by heating up the permanent magnet. The total duration of the treatment according to the present invention is, however, depending on the size of the permanent magnet in question and on the thickness of the coating layer, between 30 minutes and three hours, advantageously between 50 minutes–1.5 hours. Thus, the duration of the treatment is at best the same as that of the thermal treatment only, if prior art methods are applied.

The coating provided by the method of the present invention is accurately adjustable, and the coating adheres to the magnet. The achieved thickness of the coating varies between 10–100 μm, advantageously between 15–30 μm, depending on the particular use in question. A suitable coating material for sintered permanent magnets, such as those of the type $RE_2T_{14}B$, is, for example, aluminum. In addition to this, other metals such as nickel, zinc, chromium, titanium, and different compounds of these, can be employed as coating material.

During the coating stage, some metal atoms are removed from the surface of the magnet by sputtering, but the rate at which atoms are deposited is much greater than the rate at which they are removed and therefore a coating is obtained on the surface of the magnet.

If a suitable reactant gas, such as nitrogen, is introduced into the coating chamber, the coating formed on the magnet may be a compound of the metal and the gas. For example, if nitrogen is introduced into the reaction chamber and the metal is titanium, a coating of titanium nitride will be formed.

EXAMPLE

An NEO magnet is cleaned by sputtering for 1.5 hours in an atmosphere of argon and hydrogen at a pressure of $10^{-3}$ mbar with cathode voltage of 550 v. The temperature of the magnet in the cleaning state is about 570°–580° C. During the cleaning stage, a body of titanium is present in the chamber.

After surface cleaning, coating is carried in an atmosphere of argon at a pressure of $10^{-3}$ mbar. The body of titanium is evaporated by electron bombardment. During the coating stage, which lasts about 1 hour, the magnet is at a temperature suitable for heat treatment of the magnet, typically 630° C. The total process time is about 2.5 hours.

The temperature of the magnet in the cleaning stage (570°–580° C.) is sufficient for thermal treatment of the magnet. Therefore, the magnet undergoes thermal treatment during both the cleaning stage and the coating stage, and no additional thermal treatment is necessary.

It will be appreciated that the present invention is not restricted to the particular embodiment that has been described, and that variations may be made therein without departing from the scope of the invention as defined in the appended claims and equivalents thereof. For example, if heat treatment for one hour is required, the ion plating process could comprise sputtering for 30 minutes at 630° C. and coating for 30 minutes at 630° C.

I claim:

1. A method of treating a sintered permanent magnet having the composition $RE_2T_{14}B$, where RE is a rare earth metal, T is a transition metal and B is boron, comprising placing the magnet in a chamber, cleaning the magnet by sputtering, and applying a coating to the magnet by connecting the magnet and a body of metal that is in the chamber to a dc voltage source as cathode and anode respectively, establishing a pressure of about $10^{-3}$ mbar in the chamber, heating the magnet and concurrently heating the body of metal so that the metal evaporates and is deposited on the magnet.

2. A method of treating a sintered permanent magnet having the composition $RE_2T_{14}B$, where RE is a rare earth metal, T is a transition metal and B is boron, comprising:
   (a) placing the magnet in a chamber,
   (b) cleaning the magnet by sputtering material from the surface of the magnet at a temperature of at least about 340° C. and a pressure below about $10^{-2}$ mbar,
   (c) applying a coating to the magnet by (i) connecting the magnet and a body of metal that is in the chamber to a dc voltage source as cathode and anode respectively, (ii) establishing a pressure below about $10^{-1}$ mbar in the chamber, and (iii) heating the body of metal so that the metal evaporates and is deposited on the magnet and the magnet reaches a temperature of at least about 550° C.

3. A method according to claim 2, wherein the metal is selected from the group consisting of aluminum, titanium, nickel, zinc and chromium.

4. A method according to claim 2, wherein an atmosphere of a gas that reacts with the metal is provided in the chamber during step (c), so that a compound of the metal and the gas is formed on the magnet.

5. A method according to claim 4, wherein the compound is titanium nitride.

6. A method according to claim 2, wherein an atmosphere of a gas that is inert to the metal is provided in the chamber during step (c), so that the metal is deposited on the magnet in metallic form.

7. A method according to claim 2, wherein an atmosphere of argon and hydrogen is provided in the chamber during step (b).

8. A method according to claim 2, wherein the magnet is heated to a temperature of at least about 550° C. during step (b).

9. A method according to claim 2, wherein the magnet reaches a temperature of at least about 600° C. during step (c) (iii).

10. A method according to claim 2, wherein step (b) comprises (i) connecting the magnet and an electrode that is in the chamber to a dc voltage source as cathode and anode respectively, (ii) establishing a pressure in the range from $10^{-4}$–$10^{-2}$ mbar in the chamber, (ii) establishing a potential difference between about 400 and 600 v between the cathode and the anode, and (iv) maintaining the conditions (i), (ii) and (iii) for at least about 30 minutes.

11. A method according to claim 2, wherein step (c) comprises establishing a potential difference between about 80 and 430 v between the magnet and the body of metal.

12. A method according to claim 2, wherein the pressure in the chamber during step (b) is in the range from about $10^{-4}$–$10^{-2}$ mbar.

13. A method according to claim 1, wherein the cleaning is carried out for a time such that the magnet reaches a temperature of at least 140° C., and during the step of heating the magnet the magnet is heated to a temperature of least 550° C.

14. A method according to claim 13, comprising cleaning the magnet by sputtering under conditions and for a time such that the magnet reaches a temperature of at least 550° C.

15. A method according to claim 13, wherein the step of heating the magnet comprises heating the magnet to a temperature of at least 600° C.

* * * * *